United States Patent [19]

Wilson

[11] 4,094,761

[45] June 13, 1978

[54] MAGNETRON SPUTTERING OF FERROMAGNETIC MATERIAL

[75] Inventor: Richard W. Wilson, Phoenix, Ariz.

[73] Assignee: Motorola, Inc., Schaumburg, Ill.

[21] Appl. No.: 818,681

[22] Filed: Jul. 25, 1977

[51] Int. Cl.² .............................................. C23C 15/00
[52] U.S. Cl. .................................. 204/192 M; 75/170
[58] Field of Search ........................ 204/192 M, 192 C

[56] References Cited

U.S. PATENT DOCUMENTS 4,060,470  11/1977  Clarke .............................. 204/192 R

OTHER PUBLICATIONS

J. A. Thornton, et al. "Internal Stresses In Ti, Ni, Mo, and Ta Films Deposited by Cylindrical Magnetron Sputtering," *J. Vac. Sci. Tech.*, vol. 14, pp. 164–168 (1977).

A. Aronson, et al. "Inline Production Magnetron Sputtering", *Vacuum*, vol. 27, pp. 151–153 (1977).

P. A. Albert, et al., "Influence of Biased Magnetron Deposition Parameters on Amorphous Gd–Co–Cu Properties," *J. Vac. Sci. Tech.*, vol. 14, pp. 138–140 (1977).

*Primary Examiner*—Aaron Weisstuch
*Attorney, Agent, or Firm*—John A. Fisher

[57] ABSTRACT

A method for the magnetron sputtering of ferromagnetic material. An alloy of the ferromagnetic material is formed such that the alloy retains the desired characteristics of the material but the alloy has a Curie temperature that is below the sputtering temperature. In particular, the method can be applied to nickel by alloying the nickel with copper, platinum, or tin.

1 Claim, 2 Drawing Figures

MAGNETION SPUTTERING OF FERROMAGNETIC MATERIAL

BACKGROUND OF THE INVENTION

This invention relates to a method by which ferromagnetic materials can be deposited by the magnetron sputtering technique.

There are a number of techniques used in industry for the deposition of thin films. The specific technique selected depends upon the particular application and might include high vacuum evaporation, chemical vapor deposition, plating, or sputtering. Each of these techniques offers some unique advantages. For example, almost any material can be deposited by sputtering, including both metals and insulators. With sputtering, alloys and mixtures can be deposited without fractionation and with the assurance that film composition will remain consistant from run to run. The source material will last for a large number of depositions without replenishment. Also, a further advantage of certain modes of sputtering is that the deposition is done at a relatively low temperature so that films can be applied to a number of materials that would be adversely affected by the temperatures that might be encountered with other deposition methods.

Two problems associated with classical sputter deposition are the low deposition rate and the poor power efficiency. For the most part, these problems have been overcome by the recent advances in high rate magnetic assisted or magnetron sputtering. With magnetron sputtering, magnets are located behind the cathode target in such a manner as to cause closed magnetic field loops to cut through the cathode. A portion of the magnetic field loop is in front of the front face of the cathode. The combination of magnetic field and electric field causes electrons to spiral in long confined paths giving rise to a very dense plasma immediately adjacent to the face of the target material. This dense plasma facilitates an increased yield of material sputtered from the target.

One limitation to magnetron sputtering, however, is that this technique is not amenable to the deposition of ferromagnetic materials. A target of ferromagnetic material would act as a shunt and would prevent magnetic field lines from cutting through the target and being located, as required, in front of the target. Therefore, materials such as iron or nickel cannot be magnetron sputtered. The only exception to this is that some limited success has been achieved by using specially fabricated targets in which a thin (say, about one-sixteenth of an inch) layer of the ferromagnetic material has been plated on a non-ferromagnetic base material. The layer is thin enough so as not to completely shunt the magnetic field. Use of such a target, however, defeats some of the advantages of sputtering. For example, the target is now very expensive and the source lifetime is severely limited because of the reduced amount of source material.

Some of the ferromagnetic materials have very desirable properties which render them valuable in many thin film applications. Nickel, for example, has found wide acceptance in the semiconductor industry. Accordingly, a need has existed for an improved method for the magnetron sputtering of ferromagnetic materials that would preserve the desired nonmagnetic properties of the materials.

SUMMARY OF THE INVENTION

It is an object of this invention to provide a method for the deposition by magnetron sputtering of ferromagnetic materials.

It is a further more specific object of this invention to provide a method for the magnetron sputter deposition of nickel or other ferromagnetic materials which will preserve the desirable nonmagnetic properties of the ferromagnetic material.

The magnetron sputtering of ferromagnetic materials can be accomplished by using as a target material a properly selected alloy of that material. The alloy selected must have a Curie temperature that is lower than the temperature maintained by the target prior to or during the sputtering process. The alloy selected must also be one that preserves the other desirable properties of the ferromagnetic material itself. Specifically, nickel can be deposited by magnetron sputtering by forming an alloy of nickel with about thirty to thirty-five atomic percent of copper. This alloy has a Curie temperature which is below the normal sputtering temperature, but the alloy still retains the desirable properties of nickel in terms of stiffness, thermal heat transfer, corrosion resistance, and solderability.

DETAILED DESCRIPTION OF THE INVENTION

Figure 1:
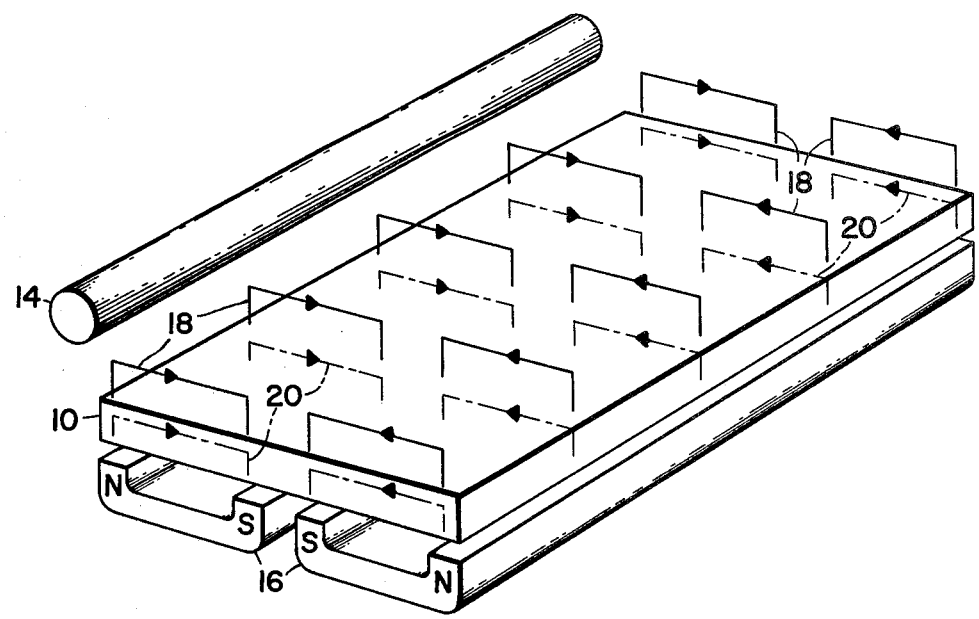
FIG. 1 is a schematic representation of a magnetron sputtering apparatus.

Turning first to Figure 1, there is shown in schematic representation an apparatus for depositing materials by the magnetron sputtering technique. The cathode target 10 is fabricated of the material desired to be deposited in a thin film layer on the work piece 12. The anode 14 is generally maintained at electrical ground potential or at a small positive potential, and a field is established between the cathode 10 and the anode 14. Magnets 16 are placed behind the cathode 10 to cause magnetic field lines such as indicated by the line 18. The closed-loop magnetic field lines 18 pass through the cathode 10 such that a portion of the field lines exist in the space in front of cathode 10. Electrons in front of the cathode will be acted upon by the force of the combined electric and magnetic fields. Such a force constrains the electrons to long spiraling paths immediately adjacent to the front surface of the cathode target 10. It is this electromagnetic confinement of the electrons near the cathode that enhances the plasma and improves the efficiency of the magnetron sputtering apparatus.

If the cathode 10, however, is comprised of a ferromagnetic material, this material shunts the magnetic field. Magnetic field lines will then follow a path through the cathode material as depicted by the dotted lines 20. Because no magnetic field lines exist in front of the cathode, there can be no enhanced plasma.

The Curie temperature is defined as that temperature above which spontaneous magnetization vanishes. The Curie temperature separates the disordered paramagnetic phase from the order ferromagnetic phase. Stated in another way, at temperatures below a material's Curie temperature, that material is strongly magnetic. At temperatures above the Curie temperature the magnetic properties disappear.

The Curie temperature varies over a wide range for various materials and can be different for alloys than for any of the constituents of the alloy. By properly forming an alloy of a ferromagnetic material with one or more other elements, the Curie temperature can be reduced to a temperature lower than the desired sputtering temperature. With the lowered Curie temperature, the alloy is non-ferromagnetic at the sputtering temperature, and is therefore amenable to magnetron sputtering.

Figure 2:
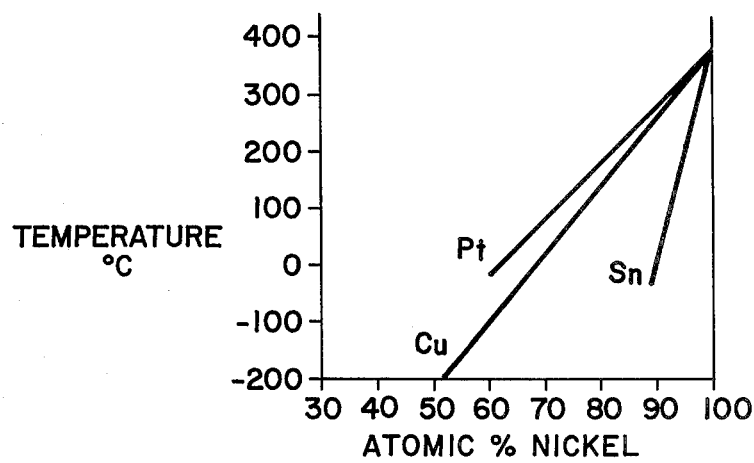
FIG. 2 shows the Curie temperature or a function of alloy composition for three different alloys of nickel.

There are many ferromagnetic materials that can be so alloyed to reduce the Curie temperature in this manner. In accordance with the invention, three specific but nonlimiting examples are herein set forth. Nickel, which is a highly desirable thin film metal for many applications has a Curie temperature of approximately 370° C. It is usally desired to do magnetron sputtering with the target held near room temperature, and at room temperature nickel is ferromagnetic. FIG. 2 is a graph showing the Curie temperature as a function of alloy composition for three different alloys of nickel. These include alloys of nickel and copper, nickel and tin, and nickel and platinum. In the preferred embodiment of this invention an alloy of nickel with about thirty to thirty-five atomic percent copper is used as a target for magnetron sputtering. That particular alloy has a Curie temperature which lies in the range between +20° C. and −40° C. This alloy is very nickel-like in all of its non-magnetic properties, and therefore finds use, for example, in multi-metal innerconnection schemes on semiconductor devices. The alloy adheres to both silicon and silicon dioxide better than pure copper alone. The nickel-copper alloy also has good solderability; that is, the alloy is easily wet by the solder, but does not dissolve in the solder. Like nickel, the alloy is also a relatively poor thermal conductor. In like manner, an alloy of nickel with about forty atomic percent platinum or an alloy of nickel with about ten atomic percent tin can be readily deposited by the magnetron sputtering technique and yet both of these alloys retain their nickel-like properties.

Thus, it is apparent that there has been provided, in accordance with the invention, a method by which ferromagnetic materials may be deposited by magnetron sputtering techniques.

What is claimed is:

1. An improved method for producing a magnetron sputtered film having the properties of a ferromagnetic material wherein the improvement comprises using a cathode target formed of said ferromagnetic material alloyed with a nonferromagnetic material to lower the Curie temperature of the alloy to less than the temperature maintained by said cathode target during the magnetron sputtering.

* * * * *